US007580249B2

(12) United States Patent
Tsuji

(10) Patent No.: US 7,580,249 B2
(45) Date of Patent: Aug. 25, 2009

(54) IMAGE FORMING APPARATUS

(75) Inventor: Hirohiko Tsuji, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 340 days.

(21) Appl. No.: 11/593,053

(22) Filed: Nov. 6, 2006

(65) Prior Publication Data

US 2007/0115608 A1 May 24, 2007

(30) Foreign Application Priority Data

Nov. 7, 2005 (JP) ............................ 2005-321755

(51) Int. Cl.
*H05K 5/00* (2006.01)
*H05K 7/00* (2006.01)

(52) U.S. Cl. ............................ 361/679.21; 361/679.02

(58) Field of Classification Search ................. 361/681, 361/683, 679.02, 679.21
See application file for complete search history.

(56) References Cited

U.S. PATENT DOCUMENTS

| | | | | |
|---|---|---|---|---|
| 5,877,746 | A * | 3/1999 | Parks et al. | 345/156 |
| 6,275,376 | B1 * | 8/2001 | Moon | 361/683 |
| 6,781,821 | B2 * | 8/2004 | Tsubai | 361/681 |
| 7,352,568 | B2 * | 4/2008 | Ishida et al. | 361/683 |
| 2003/0063269 | A1 * | 4/2003 | Nozaki | 355/133 |
| 2005/0125570 | A1 * | 6/2005 | Olodort et al. | 710/15 |

FOREIGN PATENT DOCUMENTS

| | | | |
|---|---|---|---|
| JP | 9-197975 | A | 7/1997 |
| JP | 2003-84261 | A | 3/2003 |

* cited by examiner

*Primary Examiner*—Jayprakash N Gandhi
*Assistant Examiner*—Anthony M Haughton
(74) *Attorney, Agent, or Firm*—Crowell & Moring LLP

(57) ABSTRACT

A display unit 5 of an image forming apparatus 1 has an LCD 52 held with an outer frame 51 made of resin molding. The display unit 5 is rotatably attached to a scanner housing 21 with rotation shafts 51 a of the outer frame 51 on the scanner housing 21. The LCD 52 is connected to a circuit board accommodated in the scanner housing 21 through a flexible circuit board 81. A portion of the flexible circuit board 81 extended outward from the vicinity of the rotation shafts 51 a of the outer frame 51 toward the inside of the scanner housing 21 is covered with a protector 53 integrally formed with the outer frame 51. Thus, a creeping distance between the vicinity of the rotation shafts 51 a of the outer frame 51 and the portion of the flexible circuit board 81 drawn from the outer frame 51 becomes larger than a predetermined distance necessary for preventing discharge of static electricity to the flexible circuit board 81 from the outside of the housing 10.

12 Claims, 4 Drawing Sheets

IMAGE FORMING APPARATUS

BACKGROUND OF THE INVENTION

1. Field of the Invention

The present invention relates to an electronic appliance, and especially relates to an image forming apparatus which is configured so that an angle of a display is variable with respect to a housing of the image forming apparatus.

2. Description of the Related Art

An electronic appliance including an image forming apparatus having a display such as a liquid crystal display capable of varying an angle thereof with respect to a housing (hereinafter referred to as a variable display) has been conventionally used. In such electronic appliance, to improve visibility of the variable display for the user, the angle of the variable display with respect to the housing can be varied by rotatably bearing a display unit, which is held with a resin molded outer frame, on the housing. In the electronic appliance, in the case where a control unit for controlling display of an image on the variable display is accommodated in the housing, the control unit is connected to the variable display, for example, with a flexible circuit board. The flexible circuit board is provide to be extended outward from a gap formed in the vicinity of a region where the outer frame is borne on the housing to the outside of the outer frame, and is connected to the control unit in the housing.

In such electronic appliance, since the display unit is rotatable with respect to the housing, a gap may be formed between the outer frame which holds the variable display and the housing. In the conventional electronic appliance, in a case where a distance between the housing or the outside of the outer frame and the flexible circuit board is short, that is, a creeping distance between the outside of the outer frame and the flexible circuit board is short, when the display unit is rotated, static electricity may be discharged from the user's fingertip to the flexible circuit board. When the static electricity is discharged to the flexible circuit board, the static electricity may flow to the variable display and the control unit through the flexible circuit board, thereby possibly damaging these elements. This contributes to failure of the electronic appliance. For preventing such damaging due to the static electricity, the flexible circuit board is conventionally coated with an insulative material or a conductive plate connected to the earth is provided in the vicinity of the flexible circuit board, so that the static electricity may not be discharged to the flexible circuit board. However, such a prevention measure disadvantageously causes an increase in manufacturing costs of the electronic appliance.

In an electronic appliance capable of preventing failure due to static electricity as disclosed in Japanese Laid-Open Patent Publication No. 2003-84261, a conductive member connected to the earth is provided below a liquid crystal display to prevent influence of static electricity on the liquid crystal display. Japanese Laid-Open Patent Publication No. 9-197975 discloses an electronic appliance in which a liquid crystal display is protected against static electricity by disposing a bent piece as a part of a housing between a terminal of the liquid crystal display and a front plate located on the front surface of the metal housing. However, these patent documents disclose any effective solution to prevent discharge of static electricity to the flexible circuit board as described above.

SUMMARY OF THE INVENTION

The present invention in conceived to solve the above mentioned problem, and an object of the present invention is to provide an image forming apparatus and an electronic appliance which can eliminate failure of a variable display and a control unit due to static electricity by preventing a flexible circuit board from being charged by the static electricity from outside of a housing at low manufacturing costs.

An electronic appliance in accordance with an aspect of the present invention comprises a housing, a display unit which is rotatably provided on the housing, and has a display device and an outer frame made of resin molding for holding the display device; and a controller which is accommodated in the housing, is connected to the display device through a flexible circuit board and controls image displaying operation of the display device.

The display unit is configured so that the outer frame is rotatably borne on the housing and the angle of the display device with respect to the housing can be varied. A protector is integrally formed with the outer frame, which covers a portion of the flexible circuit board drawn from the outer frame so that a creeping distance between an outer surface of the outer frame in a vicinity of rotation shafts and the portion of the flexible circuit board extended outward from the outer frame becomes larger than a predetermined distance necessary for preventing discharge of static electricity to the flexible circuit board from outside of the housing.

On the other hand, an image forming apparatus in accordance with an aspect of the present invention comprises:

a housing;

a sheet conveyor which is provided in the housing, and conveys a recording sheet in the housing;

an image forming mechanism which is provided in the housing, and forms an image on the recording sheet conveyed by the sheet conveyor based on image data;

a controller which is accommodated in the housing and controls the sheet conveyor and the image forming mechanism; and a display unit which is rotatably provided on the housing, and has a liquid crystal display device connected to the controller through a flexible circuit board and displaying information transmitted from the controller thereon and an outer frame made of resin molding for holding the display device.

The display unit is configured so that the outer frame is rotatably borne on the housing and an angle of the liquid crystal display device with respect to the housing can be varied.

The flexible circuit board is provided so as to be extended from a vicinity of rotation shafts of the outer frame rotatably born on the housing toward an inside of the housing.

A protector is integrally formed with the outer frame, which covers a portion of the flexible circuit board drawn from the outer frame so that a creeping distance between an outer surface of the outer frame in a vicinity of the rotation shafts and the portion of the flexible circuit board extended from the outer frame becomes larger than a predetermined distance necessary for preventing discharge of static electricity to the flexible circuit board from outside of the housing.

With the above-mentioned configurations, since the creeping distance between the outer surface of the outer frame in the vicinity of the rotation shafts of the outer frame and the portion of the flexible circuit board extended outward from the outer frame is made larger than the predetermined distance as mentioned above, so that failure of the liquid crystal display and the controller due to static electricity can be prevented. Since the protector is integrally formed with the outer frame which is made of resin molding, the manufacturing cost of the electronic appliance or the image forming apparatus is rarely increased in comparison with that of the conventional electronic appliance or the conventional image forming apparatus.

DETAILED DESCRIPTION OF THE EMBODIMENT

Figure 1:
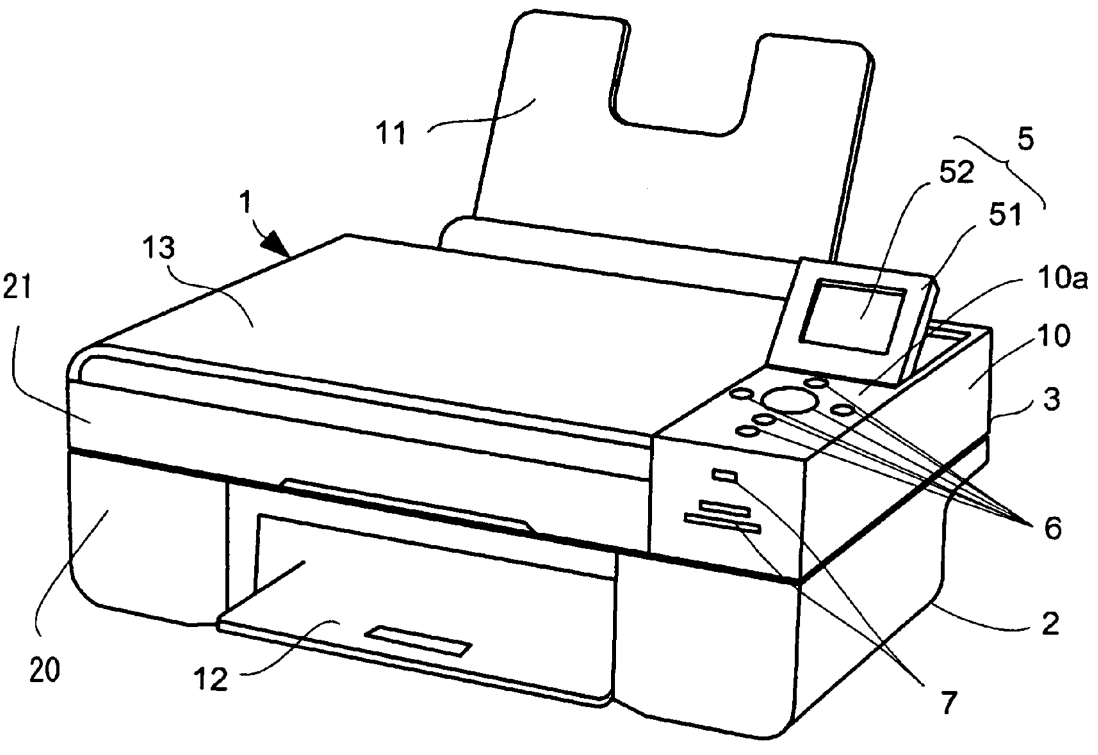
FIG. 1 is a perspective view of an image forming apparatus in accordance with an embodiment of the present invention.
Figure 2:
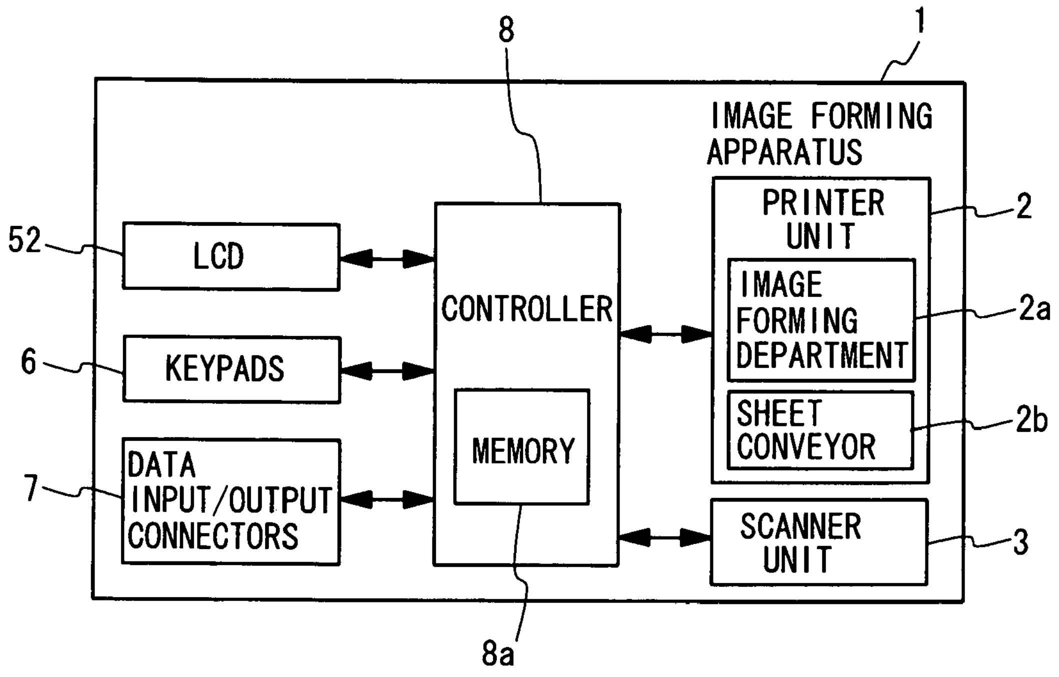
FIG. 2 is a block diagram showing a configuration of the image forming apparatus.

An embodiment of the present invention will be described with reference to figures. FIG. 1 shows an appearance of an image forming apparatus which is an example of an electronic appliance in accordance with this embodiment. FIG. 2 shows a block configuration of the image forming apparatus.

As can be seen from FIGS. 1 and 2, the image forming apparatus 1 is comprised of a printer unit 2 and a scanner unit 3 which is disposed above the printer unit 2. The printer unit 2 has a function of forming an image on a recording paper sheet. The scanner unit 3 has a function of reading a manuscript as image data. A housing 10 of the image forming apparatus 1 is constituted by a printer housing 20 and a scanner housing 21 which are made of resin molding. The printer housing 21 is rotatably hinged on the printer housing 20 in a rear side of the printer housing 20.

An image forming mechanism 2*a* such as an inkjet printing mechanism for forming an image on a recording paper sheet and a sheet conveyer 2*b* for conveying the recording paper sheet into an inside of the printer unit 2 in a predetermined sheet conveying direction are provided in the printer housing 20 of the printer unit 2. The recording sheets which are to be conveyed into the inside of the printer unit 2 are mounted on a sheet feed tray 11 provided in the rear side of the printer housing 20. A sheet exit tray 12 is provided in a lower front portion of the printer housing 20. The recording paper sheet on which an image is formed by the printer unit 2 is exited to the sheet exit tray 12.

An upper surface of the scanner unit 3 is covered with a manuscript table cover 13. The manuscript table cover 13 is hinged in a rear side of the scanner housing 21 of the scanner unit 3 so as to be rotatable with respect to the scanner housing 21.

An operation panel 10*a* having operation buttons or keypads 6 is provided in a front right side of a top face of the scanner housing 21. A display unit 5 which includes an LCD (Liquid Crystal Display) 52 is provided in a rear right side of the top face of the scanner housing 21. The LCD 52 is held on an outer frame 51 which is made of resin molding and rotatably borne on the scanner housing 21 so that an angle of the LCD 52 with respect to the top face of the scanner housing 21 can be varied. Data input/output connectors 7 such as a USB connector and card connectors compatible with various memory cards such as CompactFlash (registered trademark) are provided on a front face of the scanner housing 21.

Figure 3:
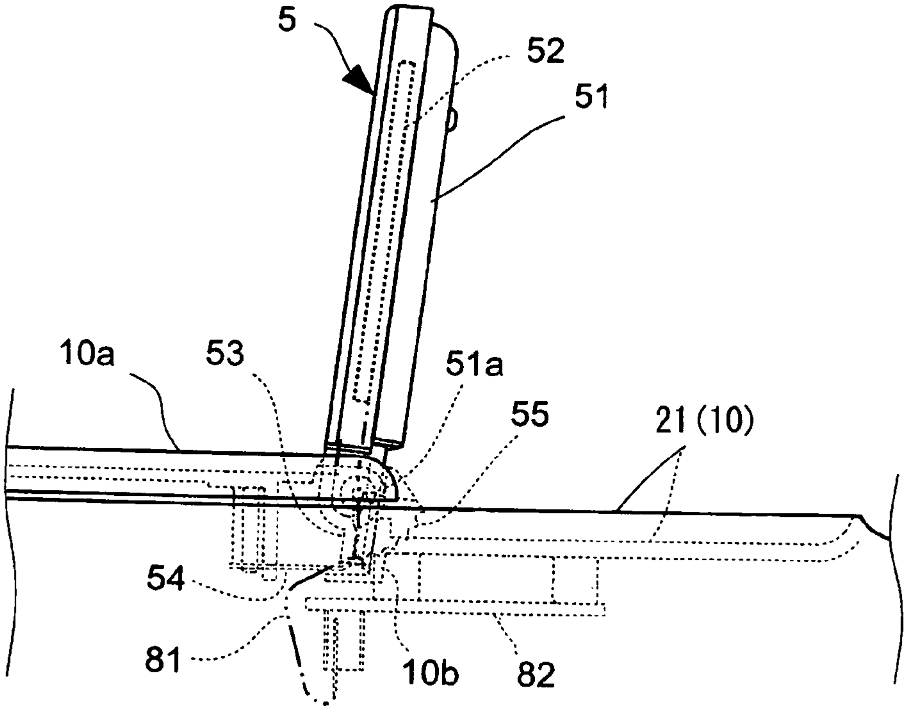
FIG. 3 is a side view showing a part of the image forming apparatus where a display unit is attached.

As shown in FIG. 2, a controller 8 formed of an ASIC (Application Specific Integrated Circuit), for example, is provided in the scanner housing 21 as shown in FIG. 3. The controller 8 can communicate with the printer unit 2, the scanner unit 3, the LCD 52, the operation buttons or keypads 6 and the data input/output connectors 7. A memory 8*a* which stores, for example, image data to be printed by the printer unit 2 and image data scanned by the scanner unit 3 therein is provided in the controller 8.

The image forming apparatus 1 is generally connected to, for example, an external personal computer. When a predetermined command or image data is transmitted to the controller 8 from the external personal computer in which a driver program is executed, the controller 8 controls the image forming department 2*a* and the sheet conveyer 2*b* to perform the printing operation for printing an image on the recording paper sheet or controls the scanner unit 3 to perform the scanning operation for reading a manuscript as image data.

The printer unit 2 is, for example, an inkjet printer which forms an image on a recording paper sheet by applying ink drops corresponding to the image data. The image forming mechanism 2*a* is comprised of ink cartridges with printing heads, a carriage on which the ink cartridges are mounted, and a DC motor for driving the carriage in a direction perpendicular to the sheet conveying direction. The sheet conveyer 2*b* is constituted by rollers for conveying a recording sheet in the sheet conveying direction and a motor for driving the rollers. The detailed constitution of the printer unit 2 is not illustrated because it is known.

The printing operation is performed by emitting ink drops of colors from the recording heads of the ink cartridges to the recording paper sheet while the carriage is reciprocally moved in the direction perpendicular to the sheet conveying direction and while the recording paper sheet is conveyed in the sheet conveying direction by the sheet conveyer 2*b*.

Constitution of the printer unit 2 is not limited to this. For example, the printer unit 2 may be a laser printer by which the image is formed on a recording paper sheet according to electrophotography of allowing toner to be adhered on the recording sheet by static electricity and heating the recording paper sheet with a pressure.

The scanner unit 3 is comprised of a manuscript table made of a translucent member such as a glass plate, a scanning unit such as a CIS (Contact Image Sensor) and a driving mechanism for moving the scanning unit along an inner surface of the manuscript table. Detailed constitution of the scanner unit 3 is not illustrated because it is known. The manuscript is generally placed on an outer surface of the manuscript table so as to be pressed to the manuscript table by the manuscript table cover 13. The scanning operation is performed by reading an image of the manuscript placed on the manuscript table one scanning line by one while moving the scanning unit along the inner surface of the manuscript table. The image data read by the scanner unit 3 is stored in the memory 8*a* of the controller 8. The image data is used in the printing operation of the printer unit 2 or transmitted to an external personal computer or the like connected to the image forming apparatus 1.

When an external device or a memory card in which the image data is/are recorded is connected to the data input/ output connector 7, the image forming apparatus 1 can form an image or images on a recording paper sheet or recording paper sheets under control of the controller 8. When a signal is transmitted from the operation panel 10*a* to the controller 8 corresponding to operating of the operation buttons or keypads 6 operated by a user, the image forming apparatus 1 performs the operation of the scanner unit 3 or the printer unit 2 according to the signal. The controller 8 has a function of displaying the operating condition of the image forming apparatus 1, information of the image to be printed and so on, on the LCD 52 so that the user may handle the image forming apparatus 1 more conveniently.

Figure 4:
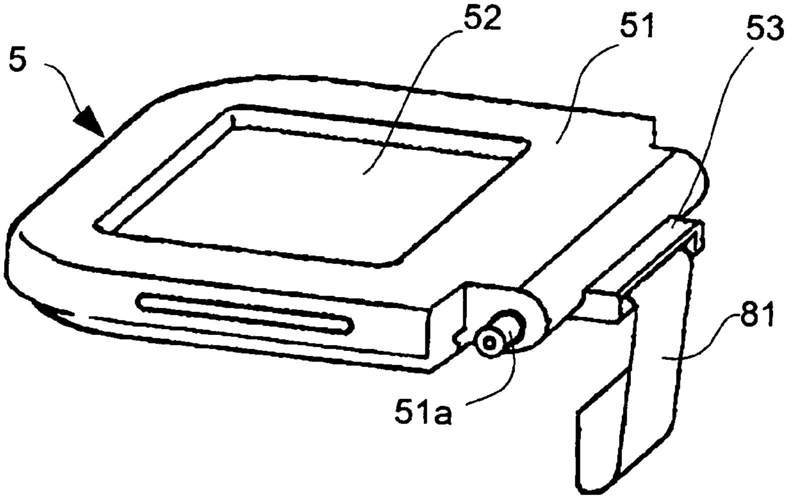
FIG. 4 is a perspective view showing the display unit of the image forming apparatus.

FIG. 3 shows a part of the image forming apparatus 1 where the display unit 5 is attached. FIG. 4 shows an appearance of the display unit 5. As described above, the display unit 5 has the LCD 52 which is held with the outer frame 51. Since rotation shafts 51*a*, which are integrally formed with the outer frame 51, are borne by bearing portions formed on the scanner housing 21, the display unit 5 is rotatable with respect to the scanner housing 21. As shown in FIG. 3, the LCD 52 is connected to a circuit board 82 accommodated in the scanner housing 21 through a flexible circuit board 81. The circuit board 82 is a member forming a part of the controller 8. Therefore, the LCD 52 can communicate with the controller 8 via the flexible circuit board 81. The display unit 5 is configured so that a fixing plate 54 such as a metal plate fixed on the scanner housing 21 may be latched with a plate 55 which has teeth and is attached to the outer frame 51. Thus, the display unit 5 can be held in a state where an angle of the LCD 52 with respect to the top face of the scanner housing 21 is adjusted to an arbitrary angle by rotating the display unit 5.

The flexible circuit board 81 has a structure that a circuit pattern formed by etching a copper foil is laminated with resin films so that it has flexibility. As shown in FIG. 4, the flexible circuit board 81 is provided to be extended outward from the outer frame 51 and the inside of the scanner housing 21 from a vicinity of the rotation shafts 51*a* of the outer frame 51. A protector 53 is formed on a portion of the outer frame 51 from which the flexible circuit board 81 extended outward from the outer frame 51 so as to cover the flexible circuit board 81 integrally with the outer frame 51. In other words, the protector 53 is formed so as to cover the portion of the flexible circuit board 81 from the vicinity of the rotation shafts 51*a* of the outer frame 51 to the inside of the housing 10. The protector 53 is formed to protrude outward in a direction perpendicular to the rotation shafts 51*a*, and has a rectangular opening through which the flexible circuit board 81 is extended outward.

Figure 5:
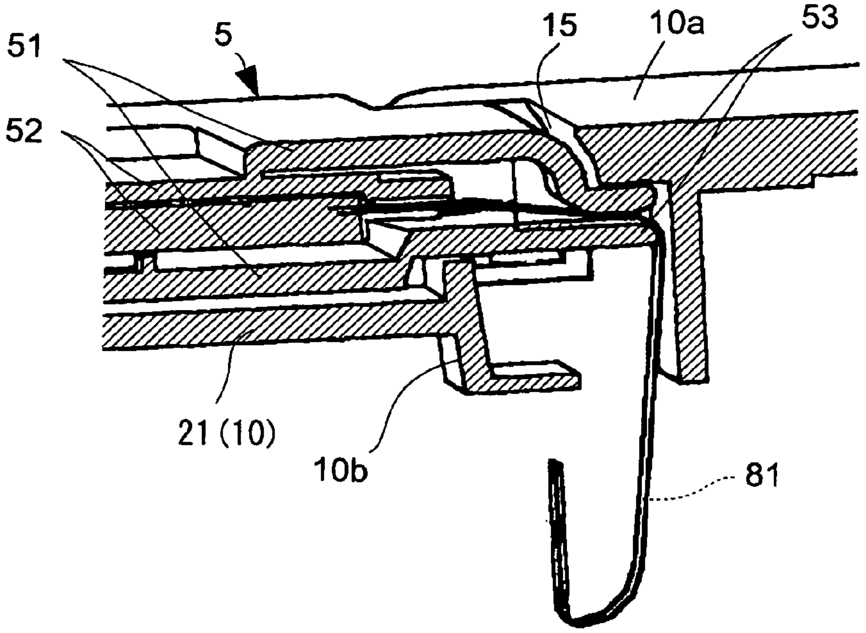
FIG. 5 is a sectional perspective view showing a configuration of the part of the image forming apparatus where the display unit is attached when the display unit lies down.
Figure 6:
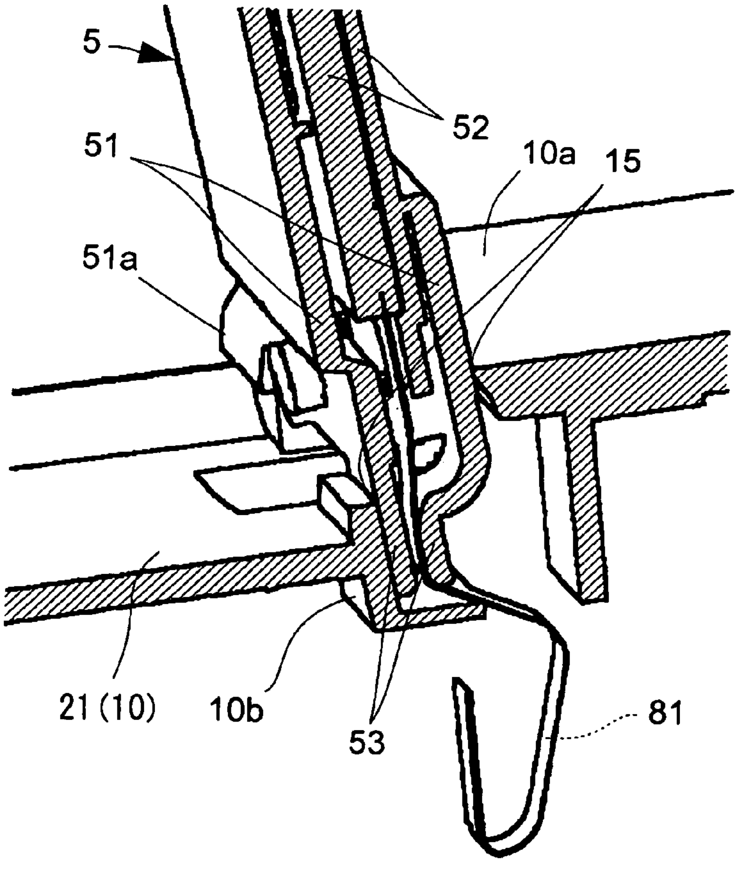
FIG. 6 is a sectional perspective view showing a configuration of the part of the image forming apparatus where the display unit is attached when the display unit stands up.

FIG. 5 and FIG. 6 respectively show a part of the image forming apparatus 1 where the display unit 5 is attached. FIG. 5 shows a state where the display unit 5 lies down so that the LCD 52 becomes parallel to the upper surface of the operation panel 10*a* of the scanner housing 21. Under such a state, since the protector 53 is formed on the outer frame 51 as described above, the portion of the flexible circuit board 81, which is extended outward from the protector 53 to the outside outer frame 51, is distant from a gap 15 between the display unit 5 and the scanner housing 21. The portion of the flexible circuit board 81 extended outward from the protector 53 is bent toward the circuit board 82 in the scanner housing 21. As shown in FIG. 5, since the protector 53 overlaps with a part of the operation panel 10*a* of the scanner housing 21, the flexible flat cable 81 cannot be seen from outside of the scanner housing 21.

FIG. 6 shows a state where the display unit 5 stands up so that the angle of the LCD 52 with respect to the scanner housing 21 takes a predetermined angle near to 90 degrees. When the display unit 5 is rotated from the state where the display unit 5 lies down shown in FIG. 5 to a state where the display unit 5 stands up shown in FIG. 6, the LCD 52 faces a user who stands in front of the image forming apparatus 1. In such a condition, the flexible circuit board 81 bends to a state where the portion of the flexible circuit board 81 extended outward from the protector 53 is folded to the opposite side while the flexible circuit board 81 is connected to the circuit board 82.

As shown in FIG. 6, when the angle of the LCD 52 with respect to the scanner housing 21 reaches a predetermined angle near to 90 degrees by rotation of the display unit 5, the protector 53 of the display unit 5 comes into contact with a stopper 10*b* formed on the scanner housing 21, and overlaps with a part of the operation panel 10*a* of the scanner housing 21. Therefore, the display unit 5 cannot rotate moreover so as not to take the angle of the LCD 52 with respect to the scanner housing 21 exceeding the above predetermined angle. In addition, the flexible circuit board 81 cannot be seen from the outside of the scanner housing 21. Moreover, since both surfaces of the flexible circuit board 81 are covered with the films, even if the display unit 5 is repeatedly rotated and the flexible circuit board 81 is repeatedly bent, the flexible circuit board 81 may not be damaged.

As described above, in the image forming apparatus 1, the portion of the flexible circuit board 81 extended outward from the protector 53 to the outside of the outer frame 51 is distant from the gap or gaps 15 between the display unit 5 and the housing 10, even when the display unit 5 lies down with respect to the housing 10 as shown in FIG. 5 or stands up as shown in FIG. 6. In other words, a creeping distance between the outer surface of the outer frame 51 in the vicinity of the rotation shafts 51*a* and the portion of the flexible circuit board 81 extended outward from the outer frame 51 becomes larger than a predetermined distance which is necessary for preventing discharge of static electricity to the flexible circuit board 82 from outside of the scanner housing 21. Since the creeping distance is made larger than the predetermined distance, even when the user charged with static electricity performs an operation, for example, handle the display unit 5, static electricity is not discharged to the flexible circuit board 81, thereby preventing failure of the LCD 52 and the controller 8 due to static electricity. Furthermore, since the protector 53 is integrally formed with the outer frame 51 by resin molding, the manufacturing cost of the image forming apparatus 1 is rarely increased in comparison with that of the conventional image forming apparatus. The shape of the protector 53 is not limited to the above-mentioned shape. As long as the creeping distance of about 10 mm to 15 mm between the vicinity of the rotation shafts 51*a* of the outer frame 51 and the flexible circuit board 81 is secured, any shape is acceptable.

In this embodiment, since the protector 53 comes into contact with the housing 10 when the angle of the display unit 5 with respect to the housing 10 reaches the predetermined angle, the display unit 5 does not rotate by an angle greater than the predetermined angle. Accordingly, it becomes possible to prevent damage of wiring and resin parts of the flexible circuit board 81 due to rotation of the display unit 5 by the angle greater than the predetermined angle.

The present invention is not limited to the configuration in the above-mentioned embodiment and the configuration can be variously modified so as not to deviate from the scope of the invention. For example, in addition to the LCD 52, various types of variable displays such as an electroluminescence display may be held in the display unit 5. The present invention is not applied to only the image forming apparatus 1. For example, the present invention can be also applied to various electronic appliances such as a digital still camera in which the angle of the variable display with respect to the housing 1. By making the creeping distance between the outside of the display unit 5 and the flexible circuit board 81 larger in such appliances, damage of the variable display and the controller due to static electricity can be prevented.

This application is based on Japanese patent application 2005-321755 filed Nov. 7, 2005 in Japan, the contents of which are hereby incorporated by references.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. An electronic appliance comprising:

a housing;

a display unit which is rotatably provided on the housing, and has a display device and an outer frame made of resin molding for holding the display device; and a circuit board, which is a member of a controller and accommodated in the housing, is connected to the display device through a flexible circuit board and the controller controlling image displaying operation of the display device, wherein the display unit is configured so that the outer frame is rotatably borne on the housing and the angle of the display device with respect to the housing can be varied;

a protector is integrally formed with the outer frame, which covers a portion of the flexible circuit board drawn from the outer frame so that a creeping distance between an outer surface of the outer frame in a vicinity of rotation shafts and the portion of the flexible circuit board extended outward from the outer frame becomes larger than a predetermined distance necessary for preventing discharge of static electricity to the flexible circuit board from outside of the housing;

when the display unit lies down so that the display device becomes parallel to an upper surface of the housing, a portion of the flexible circuit board extended outward from the protector is bent toward the circuit board in the housing; and when the display unit stands up so that an angle of the display device with respect to a top face of the housing takes a predetermined angle near to 90 degrees, the portion of the flexible circuit board extended outward from the protector is folded to an opposite side while the flexible circuit board is connected to the circuit board.

2. The electronic appliance in accordance with claim 1, wherein the protector is protruded outward from the vicinity of the rotation shafts in a direction perpendicular to the rotation shafts, and has a rectangular opening through which the flexible circuit board is extended outward.

3. The electronic appliance in accordance with claim 1, wherein when the display unit lies down so that the display device becomes parallel to an upper surface of the housing, the protector overlaps with a part of the housing so as not to be observed the flexible circuit board from outside of the housing.

4. The electronic appliance in accordance with claim 1, wherein when the display unit stands up so that an angle of the display device with respect to a top face of the housing takes a predetermined angle near to 90 degrees, the protector comes in contact with a stopper formed on the housing, thereby preventing the display unit rotating by an angle greater than the predetermined angle.

5. The electronic appliance in accordance with claim 4, wherein when the display unit stands up, the protector overlaps with a part of the housing so as not to be observed the flexible circuit board from outside of the housing.

6. An image forming apparatus comprising:

a housing;

a sheet conveyor which is provided in the housing, and conveys a recording sheet in the housing;

an image forming mechanism which is provided in the housing, and forms an image on the recording sheet conveyed by the sheet conveyor based on image data;

a controller which is accommodated in the housing and controls the sheet conveyor and the image forming mechanism; and a display unit which is rotatably provided on the housing, and has a liquid crystal display device connected to a circuit board which is a member of the controller through a flexible circuit board and displaying information transmitted from the controller thereon and an outer frame made of resin molding for holding the display device; wherein the display unit is configured so that the outer frame is rotatably borne on the housing and an angle of the liquid crystal display device with respect to the housing can be varied;

the flexible circuit board is provided so as to be extended from a vicinity of rotation shafts of the outer frame rotatably born on the housing toward an inside of the housing;

a protector is integrally formed with the outer frame, which covers a portion of the flexible circuit board drawn from the outer frame so that a creeping distance between an outer surface of the outer frame in a vicinity of the rotation shafts and the portion of the flexible circuit board extended from the outer frame becomes larger than a predetermined distance necessary for preventing discharge of static electricity to the flexible circuit board from outside of the housing;

when the display unit lies down so that the display device becomes parallel to an upper surface of the housing, a portion of the flexible circuit board extended outward from the protector is bent toward the circuit board in the housing; and when the display unit stands up so that an angle of the display device with respect to a top face of the housing takes a predetermined angle near to 90 degrees, the portion of the flexible circuit board extended outward from the protector is folded to an opposite side while the flexible circuit board is connected to the circuit board.

7. The image forming apparatus in accordance with claim 6, wherein the protector is protruded outward from the vicinity of the rotation shafts in a direction perpendicular to the rotation shafts, and has a rectangular opening through which the flexible circuit board is extended outward.

8. The image forming apparatus in accordance with claim 6, wherein when the display unit lies down so that the display device becomes parallel to an upper surface of the housing, the protector overlaps with a part of the housing so as not to be observed the flexible circuit board from outside of the housing.

9. The image forming apparatus in accordance with claim 6, wherein when the display unit stands up so that an angle of the display device with respect to a top face of the housing takes a predetermined angle near to 90 degrees, the protector comes in contact with a stopper formed on the housing, thereby preventing the display unit rotating by an angle greater than the predetermined angle.

10. The image forming apparatus in accordance with claim 8, wherein when the display unit stands up, the protector overlaps with a part of the housing so as not to be observed the flexible circuit board from outside of the housing.

11. The image forming apparatus in accordance with claim 6, wherein the housing is configured of a printer housing and a scanner housing which is disposed above the printer unit;

the sheet conveyor and the image forming mechanism are provided in the printer housing and a scanner unit is provided in the scanner housing; and the display unit is provided on a top face of the scanner housing.

12. The image forming apparatus in accordance with claim 11, wherein operation buttons or keypads are provided on the top face of the scanner housing in a vicinity of the display unit.

* * * * *